United States Patent
Park

(10) Patent No.: US 9,876,085 B2
(45) Date of Patent: Jan. 23, 2018

(54) ARRAY SUBSTRATE, MANUFACTURING METHOD THEREOF AND LIQUID CRYSTAL DISPLAY

(75) Inventor: Sang Jin Park, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 436 days.

(21) Appl. No.: 13/241,962

(22) Filed: Sep. 23, 2011

(65) Prior Publication Data
US 2012/0081642 A1    Apr. 5, 2012

(30) Foreign Application Priority Data
Sep. 30, 2010 (CN) .......................... 2010 1 0502098

(51) Int. Cl.
H01L 29/417 (2006.01)
H01L 27/12 (2006.01)
H01L 29/45 (2006.01)
G02F 1/1368 (2006.01)

(52) U.S. Cl.
CPC ...... H01L 29/41733 (2013.01); G02F 1/1368 (2013.01); H01L 27/124 (2013.01); H01L 29/458 (2013.01)

(58) Field of Classification Search
USPC .......................................................... 349/42
See application file for complete search history.

(56) References Cited

U.S. PATENT DOCUMENTS

| 5,432,108 A * | 7/1995 | Lee ............................... 438/157 |
| 5,539,219 A | 7/1996 | Den Boer et al. |
| 5,650,358 A | 7/1997 | Gu et al. |

(Continued)

FOREIGN PATENT DOCUMENTS

| CN | 101840118 A | 9/2010 |
| JP | 2007-115859 A | 5/2007 |

(Continued)

OTHER PUBLICATIONS

First Chinese Office Action dated May 28, 2013; Appln. No. 20111011030693.

(Continued)

*Primary Examiner* — Edward Glick
*Assistant Examiner* — Anthony G Quash
(74) *Attorney, Agent, or Firm* — Ladas & Parry LLP

(57) ABSTRACT

An array substrate comprises a base substrate on which data lines and gate lines intersecting with each other are formed to define pixel units, and a switching element is provided in each of the pixel units and comprises a gate electrode, an active layer, a source electrode and a drain electrode, and end parts of the source electrode and the drain electrode located directly on the active layer are opposite to each other to define a channel region. An extension conductive part is formed close to the source electrode or the drain electrode and to electrically contact the source electrode or the drain electrode, one end of the extension conductive part extends toward the channel to protrude from the source electrode or the drain electrode contacting with the extension conductive part and to contact the active layer at least within the channel region.

7 Claims, 7 Drawing Sheets

(56) References Cited

U.S. PATENT DOCUMENTS

| | | | | |
|---|---|---|---|---|
| 5,834,344 | A | * | 11/1998 | Cheng ............................ 438/158 |
| 5,872,370 | A | * | 2/1999 | Gu et al. .......................... 257/66 |
| 6,271,062 | B1 | * | 8/2001 | Nakata et al. ................. 438/151 |
| 9,035,312 | B2 | * | 5/2015 | Choi ................... G02F 1/13458 |
| | | | | 257/59 |
| 2002/0014666 | A1 | * | 2/2002 | Ohmi ................ H01L 21/28185 |
| | | | | 257/368 |
| 2005/0056847 | A1 | * | 3/2005 | Nakamura et al. ............. 257/72 |
| 2007/0004069 | A1 | * | 1/2007 | Cho et al. ....................... 438/30 |
| 2007/0090422 | A1 | | 4/2007 | Ishii |
| 2008/0001142 | A1 | * | 1/2008 | Cho et al. ....................... 257/40 |
| 2008/0068526 | A1 | * | 3/2008 | Ono et al. ....................... 349/46 |
| 2008/0157086 | A1 | | 7/2008 | Liu |
| 2008/0246029 | A1 | | 10/2008 | Kang et al. |
| 2008/0277666 | A1 | * | 11/2008 | Jeon .................... H01L 27/3244 |
| | | | | 257/66 |
| 2009/0227053 | A1 | * | 9/2009 | Kwon ............... G02F 1/136286 |
| | | | | 438/30 |
| 2009/0315026 | A1 | * | 12/2009 | Jeong et al. .................... 257/43 |
| 2010/0163865 | A1 | | 7/2010 | Arai |
| 2010/0224878 | A1 | * | 9/2010 | Kimura ........................... 257/57 |
| 2011/0013130 | A1 | * | 1/2011 | Choi ................. G02F 1/134363 |
| | | | | 349/141 |
| 2011/0128240 | A1 | * | 6/2011 | Choi ............................ 345/173 |

FOREIGN PATENT DOCUMENTS

| | | | | |
|---|---|---|---|---|
| KR | 10-2008-0049208 | * | 6/2008 | ............ G02F 1/136 |
| KR | 20080072378 A | | 8/2008 | |
| KR | 20090118894 A | | 11/2009 | |

OTHER PUBLICATIONS $2^{nd}$ Korean Office Action dated Apr. 1, 2013 Appln. No. 10-2011-0098554.

KIPO Decision of Rejecting Amendment dated Oct. 22, 2013; Appln. No. 10-2011-0098554.

KIPO Decision of Rejecting Amendment dated Dec. 3, 2013; Appln. No. 10-2011-0098554.

Korean Examination Report dated Jan. 16, 2014; Appln. No. 10-2011-0098554.

Japanese Office Action dated Aug. 3, 2015: Appln. No. 2011-216831.

* cited by examiner

ARRAY SUBSTRATE, MANUFACTURING METHOD THEREOF AND LIQUID CRYSTAL DISPLAY

BACKGROUND

Embodiments of the disclosed technology relate to an array substrate, a manufacturing method of the array substrate, and a liquid crystal display.

Liquid crystal displays (LCDs) are currently common flat panel displays, and thin film transistor liquid crystal displays (TFT-LCDs) are the main kind of LCDs.

A liquid crystal panel of a LCD is generally formed by assembling together an array substrate and a color filter substrate. The array substrate typically comprises a substrate, on which gate lines and data lines intersecting with each other are provided to define a plurality of pixel units arranged in a matrix form. A thin film transistor (TFT) switching element and a pixel electrode are provided in each of the plurality of pixel units. As shown in FIGS. 1A and 1B, for example, the TFT switching element comprises a gate electrode 3, an active layer 6, a source electrode 7 and a drain electrode 8. The gate electrode 3 is electrically connected to one of the gate lines or as a part of one of the gate lines and is formed on a base substrate 1, the active layer 6 is provided over the gate electrode 3 with a gate insulating layer 4 sandwiched therebetween, one end part of the source electrode 7 and one end part of the drain electrode 8 are provided to be opposite to each other on the active layer 6 and a channel region is defined between the source electrode 7 and the drain electrode 8. When the gate electrode 3 is supplied with a high voltage for turning on the switching element, electrical conduction is established between the source electrode 7 and the drain electrode 8 through the active layer 6.

In the related arts, conductive patterns on the array substrate are generally each formed by using an exposing process with a mask. For example, the source electrode and the drain electrode are formed from the same material layer by using one patterning process with a single mask. Because of the processing parameters of the patterning process, such as, sizes of patterns of the mask, precision of exposing and etching and so on, a channel length L between the source electrode and the drain electrode (distance between the source electrode and the drain electrode) has a minimum size limit. The conventional minimum value of the channel length is 4 µm. However, the conduction characteristics of the channel are depended on the channel length. The longer the channel is, the larger the size of the TFT is in order to ensure the same performance, which leads to reduced aperture ratio of one pixel unit. Therefore, reduction of the channel length is one problem to be solved.

SUMMARY

According to an embodiment of the disclosed technology, an array substrate is provided comprising: a base substrate on which data lines and gate lines intersecting with each other are formed to define a plurality of pixel units arranged in a matrix form and a switching element is provided in each of the plurality of pixel units, wherein the switching element comprises: a gate electrode, an active layer, a source electrode and a drain electrode, with end parts of the source electrode and the drain electrode located directly on the active layer being provided to be opposite to each other to define a channel region; an extension conductive part formed close to the source electrode or the drain electrode and to electrically contact the source electrode or the drain electrode, wherein one end of the extension conductive part extends toward the channel region beyond the source electrode or the drain electrode contacting with the extension conductive part and to contact the active layer at least within the channel region.

According to another embodiment of the disclosed technology, a manufacturing method of an array substrate is provided, which at least comprises: forming switching elements on a base substrate, wherein each of the switching elements comprises a gate electrode, an active layer, a source electrode and a drain electrode, and end parts of the source electrode and the drain electrode located directly on the active layer are provided to be opposite to each other to define a channel region, and before or after forming the source electrode and the drain electrode of the switching element, the method further comprising: forming a conductive thin film, patterning the conductive thin film to form an extension conductive part, wherein the extension conductive part is formed close to the source electrode or the drain electrode and to electrically contact the source electrode or the drain electrode, one end of the extension conductive part extends toward the channel region beyond the source electrode or the drain electrode contacting with the extension conductive part and to contact the active layer at least within the channel region.

According to further another embodiment of the disclosed technology, a liquid crystal display comprises a liquid crystal panel, wherein the liquid crystal panel comprises a color filter substrate and an array substrate, according to an embodiment of the disclosed technology, which are assembled together.

Further scope of applicability of the disclosed technology will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

Figure 1A:
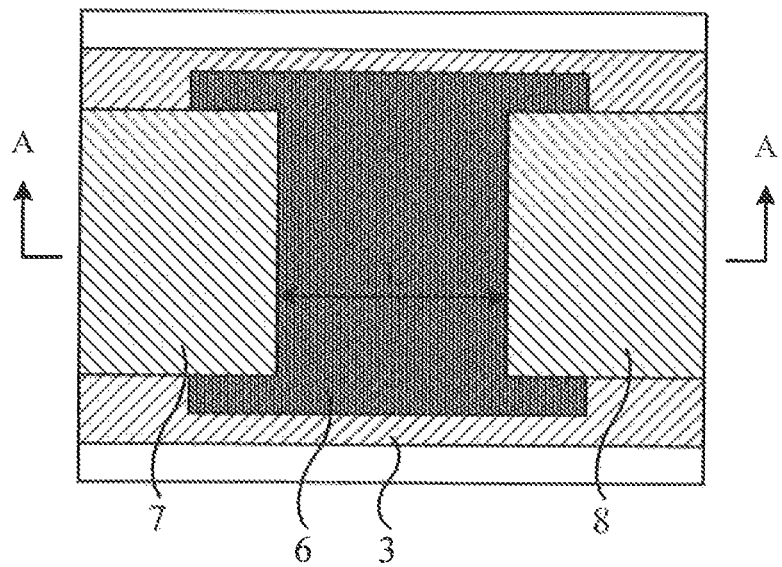
FIG. 1A is a top view schematically showing a switching element of a conventional array substrate.
Figure 1B:
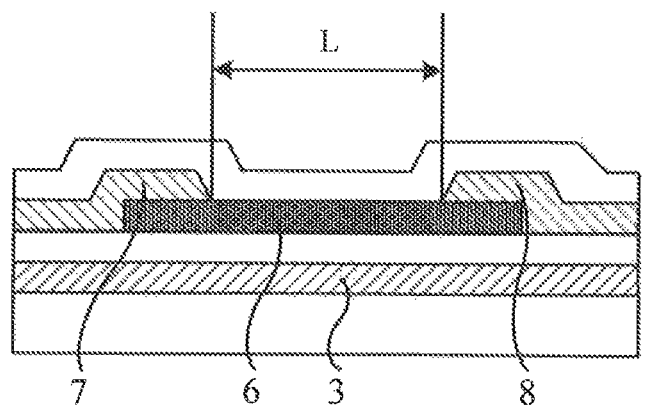
FIG. 1B is a cross sectional view taken along a line A-A in FIG. 1A.

The embodiments of the disclosed technology being thus described, it will be obvious that the same may be varied in many ways. Such variations are not to be regarded as a departure from the spirit and scope of the disclosed technology, and all such modifications as would be obvious to those skilled in the art are intended to be included within the scope of the following claims.

An embodiment of the disclosed technology provides an array substrate comprising a base substrate, wherein data lines and gate lines intersecting with each other are formed on the base substrate to define a plurality of pixel units arranged in a matrix form and a TFT switching element is formed in each of the plurality of pixel units. The TFT switching element comprises a gate electrode, an active layer, a source electrode and a drain electrode, and end parts positioned directly on the active layer of the source electrode and the drain electrode are provided to be opposite to each other; an extension conductive part is formed above and/or below at least part of the source electrode or the drain electrode, the extension conductive part extends toward the channel region beyond the source electrode or the drain electrode directly contacting with the extension conductive part and contacts the active layer, so that the extension conductive part is closer to the source electrode than the drain electrode, or closer to the drain electrode than the source electrode. in the direction of connecting the drain and source electrodes In the embodiment of the disclosed technology, the extension conductive part is independent of the source and drain electrodes and is formed for reducing an effective channel length of the TFT switching element. The extension conductive part may be formed from one conventional conductive material for manufacturing the array substrate, such as, a transparent conductive material or a metal material; or the material of the extension conductive part may be the same as or different from the material of the source and drain electrodes. The extension conductive part completely or partly and electrically contacts the source electrode or the drain electrode and electrically contacts the active layer within a channel region between the source electrode and the drain electrode; thus, the extension conductive part can play the same role as the source electrode or the drain electrode so that the extension conductive part can functions as a part of the source electrode or the drain electrode for electrical conduction. Because the extension conductive part is formed by using another patterning process independently from that for the source and drain electrodes, parameters of patterning processes for forming the source and drain electrodes would not limit the formation of the extension conductive part, and thus, the extension conductive part can protrude from the source electrode or the drain electrode to extend inward the channel region, which leads to a reduced effective channel length.

The extension conductive part can be independently formed above or below the source electrode or the drain electrode to reduce the effective channel length. The extension conductive part may cover an upper surface of the source or drain electrodes, or form below the source electrode or the drain electrode, and the extension conductive part and the source electrode or the drain electrode are electrically connected with each other. Meanwhile, in an embodiment of the disclosed technology, the type of the TFT is not limited, and the TFT may be of a top-gate type or a bottom-gate type. In an embodiment of the disclosed technology, the extension conductive part may be fabricated in compatible with existing structures and process steps. For example, in an example of the array substrate, the source electrodes, the drain electrodes, the active layers and the data lines are formed on the gate insulating layers, the pixel electrodes or the common electrodes are formed on the gate insulating layers, the material of the pixel electrodes or the common electrodes is used to form the extension conductive parts, and thus, the extension conductive parts can be formed simultaneously (in a same patterning process) with the pixel electrodes or the common electrodes without an additional and individual step to fabricate the extension conductive parts. Hereafter, the detailed description will be given with reference to specific embodiments.

First Embodiment

Figure 2A:
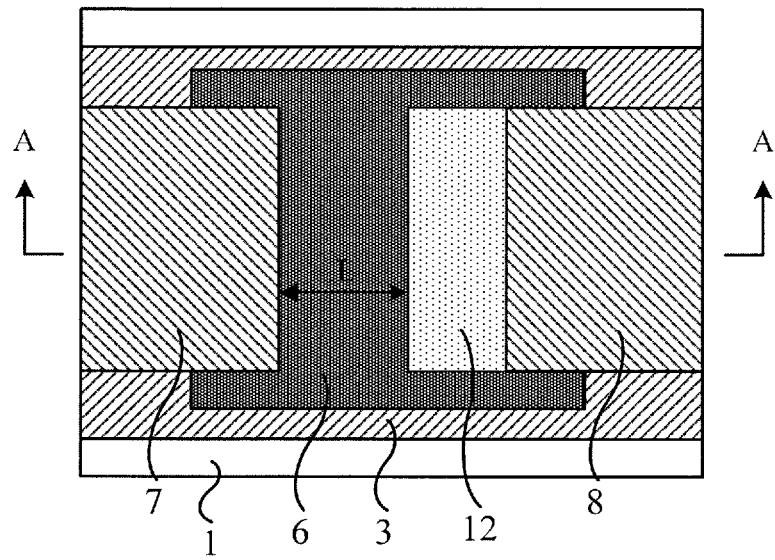
FIG. 2A is a top view schematically showing a switching element of an array substrate according to a first embodiment of the disclosed technology.
Figure 2B:
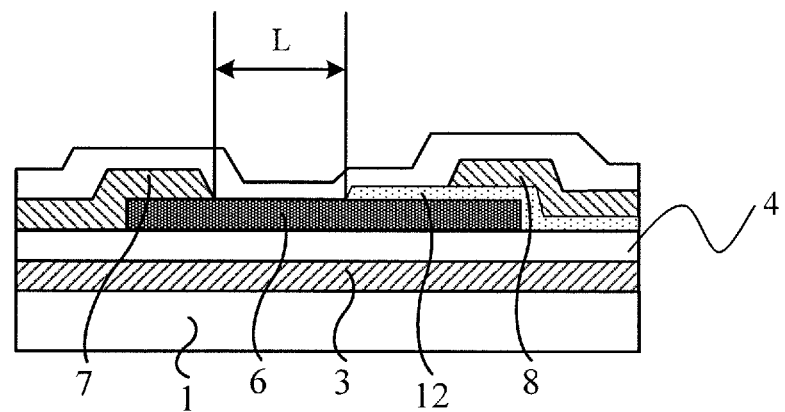
FIG. 2B is a cross sectional view taken along a line A-A in FIG. 2A.

FIG. 2A is a top view schematically showing a switching element of an array substrate according to a first embodiment of the disclosed technology, and FIG. 2B is a cross sectional view taken along a line A-A in FIG. 2A.

The array substrate comprises a substrate 1, wherein data lines and gate lines intersecting with each other are formed on the base substrate 1 to define a plurality of pixel units arranged in a matrix form. A switching element is provided in each of the plurality of pixel units, wherein the switching element is a thin film transistor (TFT). Each switching element comprises a gate electrode 3, an active layer 6, a source electrode 7 and a drain electrode 8. As shown in FIGS. 2A and 2B, the gate electrode 3 is formed on the base substrate 1, electrically connected with one gate line or formed as a part of the one gate line; a gate insulating layer 4 is formed to cover the gate electrode 3 and the gate line; the active layer 6 is formed on the gate insulating layer 4 and located over the gate electrode 3; the source electrode 7 and the drain electrode 8 are formed above the active layer 6 and contact the active layer 6, and end parts positioned directly on the active layer 6 of the source electrode 7 and the drain electrode 8 are provided to be opposite to each other and separated by a distance, and thus, the channel region of the TFT is defined between the source electrode 7 and the drain electrode 8. The above-mentioned TFT is of a bottom-gate type, wherein the gate electrode 3 is formed below the source and drain electrodes 7 and 8. In the present embodiment, an extension conductive part 12 is further formed below the drain electrode 8 and contacts the drain electrode 8, and the extension conductive part 12 is protruded from the drain electrode 8 to extend inward the channel region so that the extension conductive part 12 is closer to the source electrode 7 than the drain electrode 8, and the extension conductive part 12 contacts the active layer 6 within the channel region between the source electrode 7 and the drain electrode 8.

In the present embodiment, the extension conductive part 12 is formed from a transparent conductive material used to fabricate the pixel electrode or the common electrode, and may be formed in a same patterning process with the pixel electrode or the common electrode. For example, when the pixel electrode is fabricated, the extension conductive part 12 is formed and extend directly below the drain electrode 8 to be formed later. In the example shown in the accompanying drawings, the extension conductive part 12 and the pixel electrode 11 are formed integrally. However, in an example, the extension conductive part 12 and the pixel electrode 11 may be formed separately as long as the extension conductive part 12 is connected with the drain electrode 8.

In a variation of the above example, the extension conductive part can be formed below the source electrode 7, and is in a same patterning process formed with the pixel electrode 11 from the same material as the pixel electrode 11, and at this time, the extension conductive part is formed more protruded toward the drain electrode 8 than the source electrode 7, so that the effective channel length between the source electrode 7 and the drain electrode 8 is reduced.

Figure 3A:
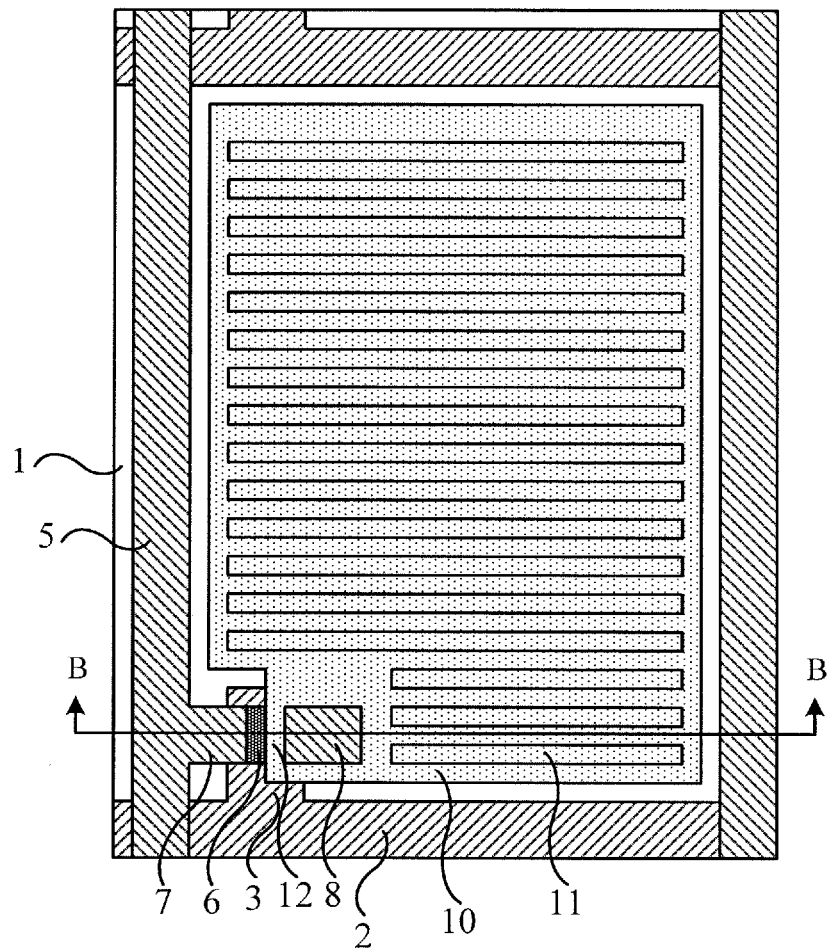
FIG. 3A is a partial top view schematically showing the array substrate according to the first embodiment of the disclosed technology.
Figure 3B:
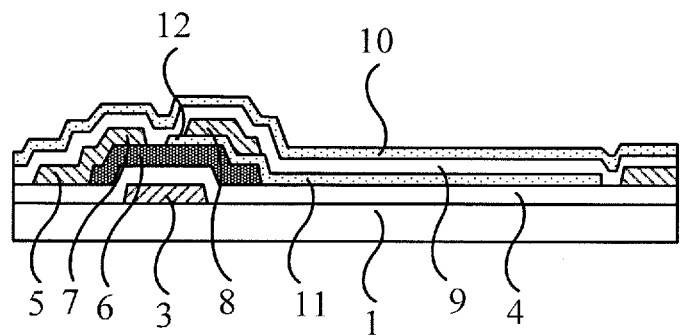
FIG. 3B is a cross sectional view taken along a line B-B in FIG. 2A.

The switching element having the above mentioned structure can be applied to any type of the array substrate for example of a Twisted Nematic (TN) type, a Fringe Field Switching (FFS) type, and the like. In an example, the above switching element is applied to a high aperture ratio FFS (HFFS) type array substrate 100, as shown in FIGS. 3A and 3B. In each pixel unit of the HFFS type array substrate 100, gate lines 2 and gate electrodes 3 are formed on a base substrate 1, and the gate electrodes 3 are branched from the gate lines 2; a gate insulating layer 4 is formed to cover the gate lines 2 and the gate electrodes 3; source electrodes 7, drain electrodes 8, an active layer 6 of TFTs and data lines 5 are formed on the gate insulating layer 4, and further, pixel electrodes 11 and extension conductive parts 12 formed from the same material as the pixel electrodes 11 are formed on the gate insulating layer 4; a passivation layer 9 is formed to cover the source electrodes 7, the drain electrodes 8, the data lines 5 and the pixel electrodes 11, and a common electrode 10 is further formed above the passivation layer 9. In the present embodiment, each extension conductive part 12 and the respective pixel electrode 11 are formed simultaneously and integrally, and the extension conductive part 12 extends below the drain electrode 8 and is located between the drain electrode 8 and the active layer 6 so that electrical connection between the extension conductive part 12 and the drain electrode 8 and that between the drain electrode 8 and the active layer 6 can be established; the extension conductive part 12 extends toward the source electrode 7 beyond the drain electrode 8 and is closer to the source electrode 7 than the drain electrode 8, so that an effective channel length between the source electrode 7 and the drain electrode 8 is practically reduced.

Because the extension conductive part and the source and drain electrodes are not formed in the same patterning process, a minimum distance between the extension conductive part and the source electrode or the drain electrode is not limited by the same patterning process parameters. With the above technical solution, the channel length can be reduced to 2.0~3.5 µm. The extension conductive part may be formed above or below either only a part of the source or drain electrode or the whole of the source or drain electrode, as long as the extension conductive part can surely electrically contact the source electrode or the drain electrode and to extend inward the channel region to protrude from the source or drain electrode and to contact the active layer within the channel region to reduce an effective channel length.

The technical solution according to an embodiment of the disclosed technology can obtain a reduced channel length, so that conductive characteristics of the TFT can be improved without additionally increasing the size of the TFT switching element.

An embodiment of the disclosed technology also provides a method for manufacturing an array substrate, and the method at least comprises a step for forming switching elements on a base substrate, wherein each of the switching elements comprises a gate electrode, an active layer, a source electrode and a drain electrode. Before or after forming the source electrode and the drain electrode of the switching element, the method further comprises: forming a conductive thin film and patterning the conductive thin film to form an extension conductive part by using a patterning process, wherein the extension conductive part is formed above and/or below at least a part of the source electrode or the drain electrode, and the extension conductive part extends toward the channel to protrude from the source electrode or the drain electrode and contacts the active layer within a channel region.

The extension conductive part can be formed with a conventional fabricating process and material; for example, the extension conductive part may be simultaneously formed with the pixel electrode or the common electrode and from the same material as the pixel electrode or the common electrode formed on the array substrate. In one example, forming the extension conductive part by using a patterning process specifically comprises: forming a transparent conductive thin film, forming the pixel electrode or the common electrode by using a patterning process and simultaneously forming the extension conductive part.

The above steps for fabricating the switching element may be used to fabricate various types of the array substrates. Hereafter, the explanation will be given with reference to an embodiment.

Second Embodiment

The second embodiment of the disclosed technology provides a method for manufacturing an array substrate. This embodiment comprises an example in which the above steps for manufacturing a switching element are used in a method for fabricating a HFFS type array substrate, wherein within each pixel unit of the HFFS type array substrate, a gate line, a data line, a common electrode and a pixel electrode are formed on a base substrate, and forming the data line, the gate line, the switching element, the pixel electrode and the common electrode on the base substrate comprising the following steps.

Figure 4A:
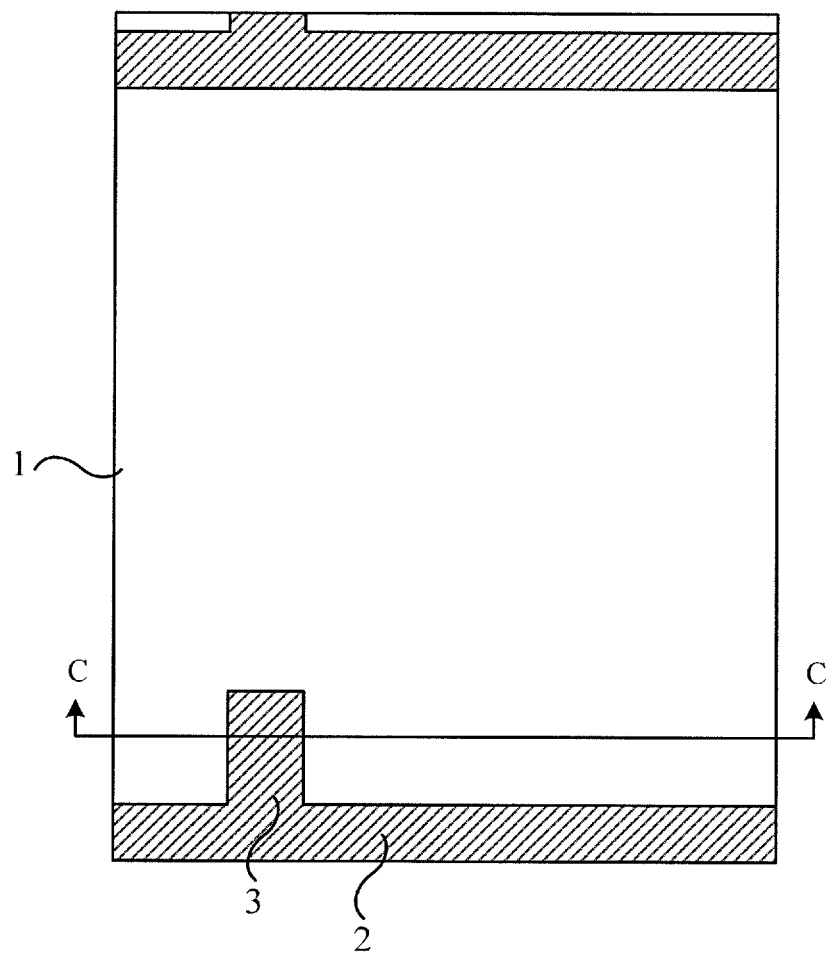
FIG. 4A is a partial top view schematically showing a step for manufacturing an array substrate according to a second embodiment of the present embodiment.
Figure 4B:
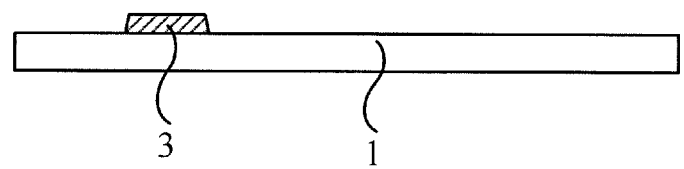
FIG. 4B is a cross sectional view taken along a line C-C in FIG. 4A.
Figure 5A:
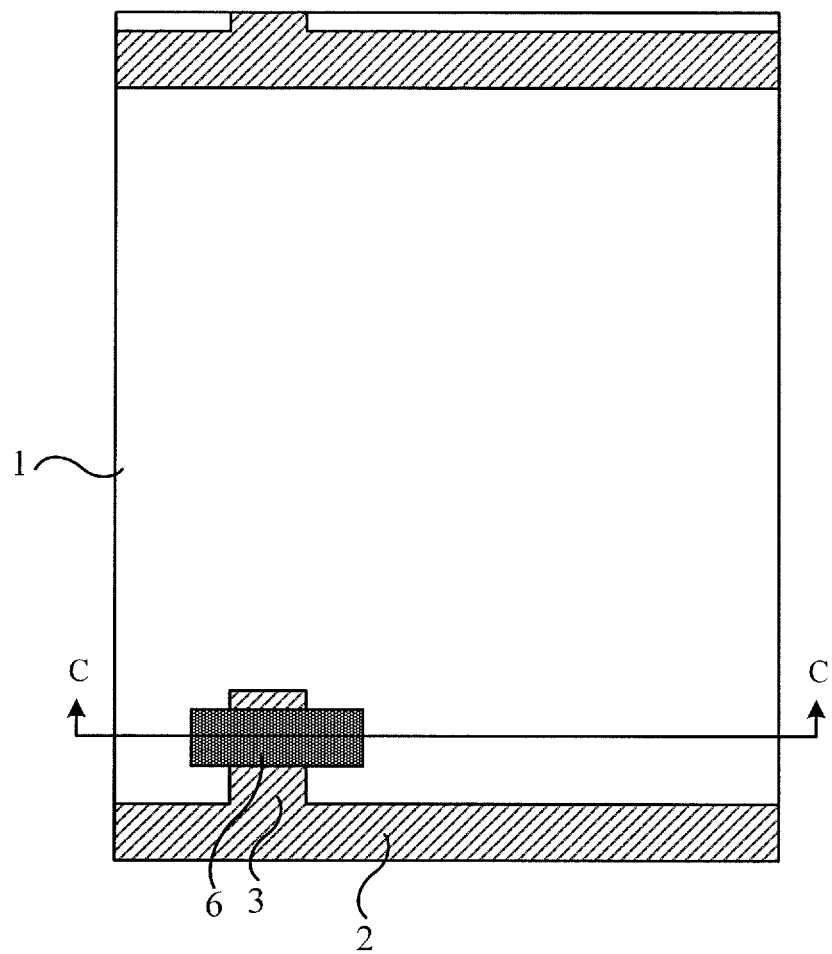
FIG. 5A is a partial top view schematically showing a step for manufacturing the array substrate according to the second embodiment of the present embodiment.
Figure 5B:
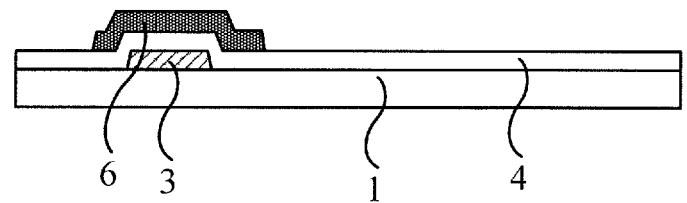
FIG. 5B is a cross sectional view taken along a line C-C in FIG. 5A.
Figure 6A:
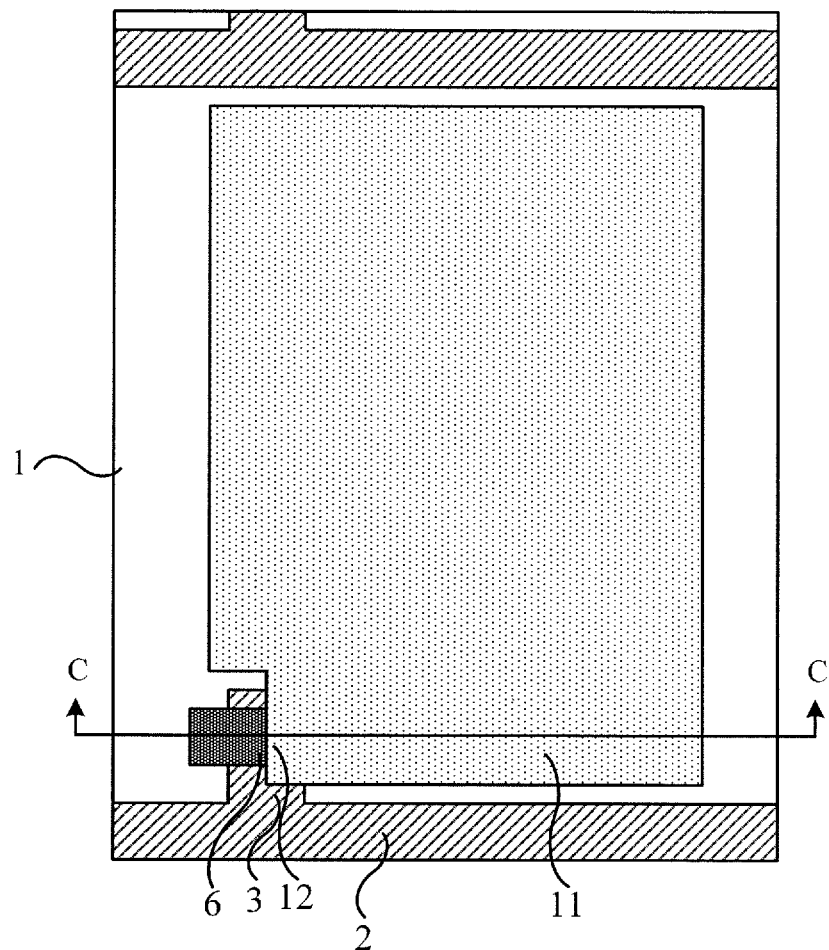
FIG. 6A is a partial top view schematically showing a step for manufacturing the array substrate according to the second embodiment of the present embodiment.
Figure 6B:
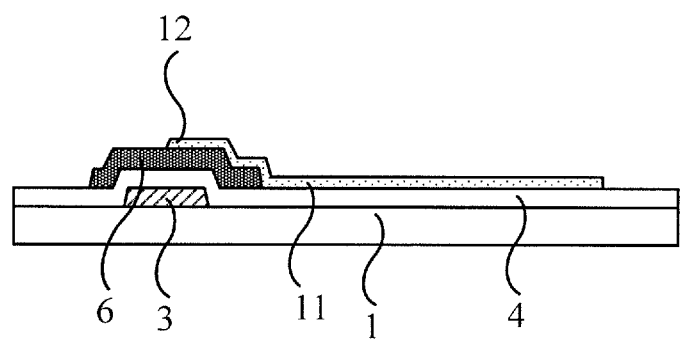
FIG. 6B is a cross sectional view taken along a line C-C in FIG. 6A.
Figure 7A:
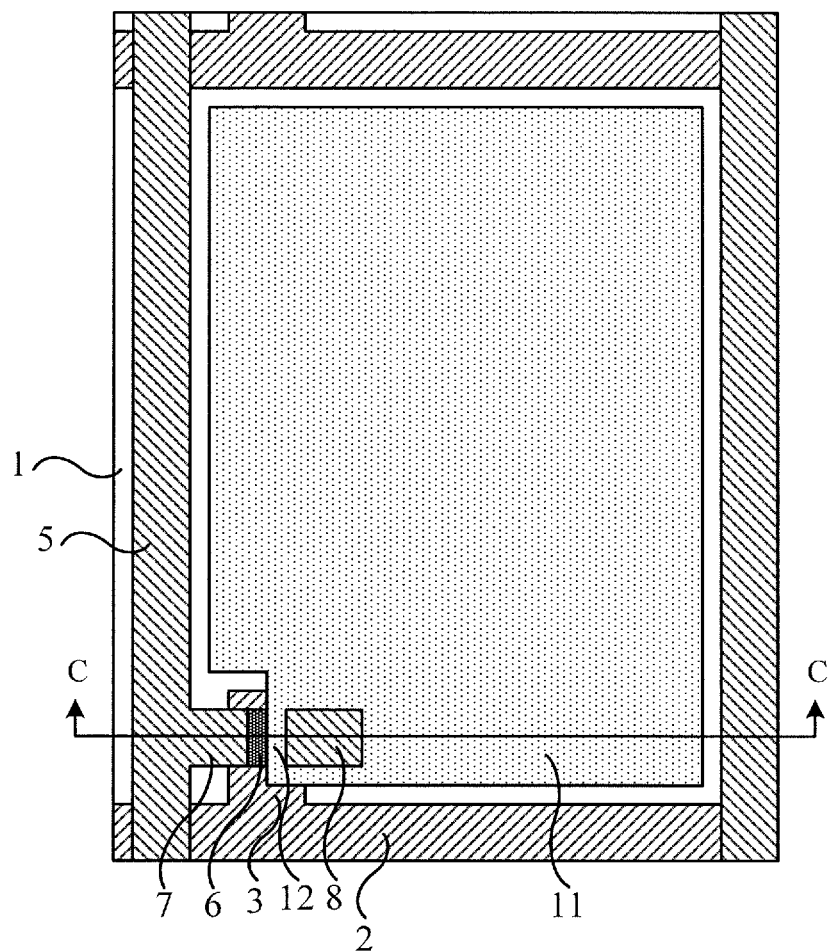
FIG. 7A is a partial top view schematically showing a step for manufacturing the array substrate according to the second embodiment of the present embodiment.
Figure 7B:
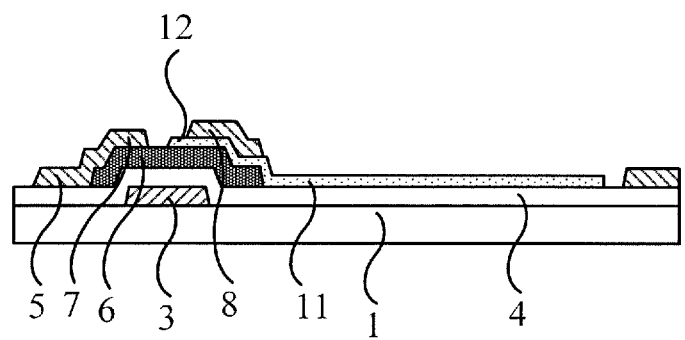
FIG. 7B is a cross sectional view taken along a line C-C in FIG. 7A.

Step 410, forming a gate metal thin film on a base substrate 1 and patterning the gate metal thin film to form a gate line 2 and a gate electrode 3 by using a patterning process, as shown in FIGS. 4A and 4B;

Step 420, forming a gate insulating layer 4 on the base substrate 1 on which the gate line 2 and the gate electrode 3 are formed in order to cover the gate line 2 and the gate electrode 3;

Step 430, forming an active layer thin film on the gate insulating layer 4 and patterning the active layer thin film to form an active layer 6 by using a pattering process, as shown in FIGS. 5A and 5B;

Step 440, forming a first transparent conductive thin film on the base substrate 1 on which the above structures are formed and forming a pixel electrode 11 and an extension conductive part 12 by using a patterning process, wherein one end of the extension conductive part 12 is formed directly on the active layer 6, as shown in FIGS. 6A and 6B;

Step 450, forming a data metal thin film on the base substrate 1 on which the above structures are formed and patterning the data metal thin film by using a patterning process to form a data line 5, a source electrode 7 and a drain electrode 8, wherein the drain electrode 8 is located above the extension conductive part 12 and contacts the extension conductive part 12, one end of the extension conductive part 12 extends toward the channel region beyond the end of the drain electrode 8, as shown in FIGS. 7A and 7B;

Step 460, forming a passivation layer 9 on the base substrate 1 on which the above structures are formed;

Step 470, forming a second transparent conductive thin film on the passivation layer 9 and patterning the second transparent conductive thin film to form a common electrode 10 by using a patterning process, as shown in FIGS. 3A and 3B.

During manufacturing processes, based on a minimum feature of the exposure apparatus used in a patterning process, the source and drain electrodes 7 and 8 are formed to have a distance of 4 µm therebetween, and the extension conductive part 12 is formed below the drain electrode 8 from ITO material used to fabricate the pixel electrode so that an effective channel length between the source and drain electrodes 7 and 8 may be reduced to 3.5~2.5 µm, even to 2.0 µm, and the position of the extension conductive part 12 need to be designed properly as long as a short-circuit does not occur between the source and drain electrodes. In the above example of the manufacturing method, the extension conductive part 12 and the pixel electrode 11 are formed integrally.

The method for manufacturing the array substrate according to an embodiment of the disclosed technology can be used to manufacture the array substrate according to an embodiment of the disclosed technology. In the switching element of the array substrate, the channel length defined by the source and drain electrodes is replaced by the effective channel length defined by the extension conductive part, so that the limitation of patterning processes can be avoided, the effective channel length is reduced, and thus, a conductive characteristics can be improved without increasing the size of the TFT switching element, and aperture ratio of a pixel unit can be increased.

An embodiment of the disclosed technology further provides a liquid crystal display comprising a liquid crystal panel, wherein the liquid crystal panel comprises a color filter substrate and an array substrate provided according to any embodiment of the disclosed technology which are assembled together. The liquid crystal display according to an embodiment of the disclosed technology may further comprise a frame, a driving circuit, a backlight assembly and other parts, and can directly use the array substrate provided by an embodiment of the disclosed technology without any change to other parts.

The array substrate and the liquid crystal display provided by an embodiment of the disclosed technology have a kind of pixel structure capable of increasing $I_{on}$ current, and the pixel structure is especially suitable for a liquid crystal panel to meet the requirements of a large size, a high resolution and a high frame rate characteristics of reducing motion blur, increasing pixel charging margin.

The embodiment of the disclosed technology being thus described, it will be obvious that the same may be varied in many ways. Such variations are not to be regarded as a departure from the spirit and scope of the disclosed technology, and all such modifications as would be obvious to those skilled in the art are intended to be included within the scope of the following claims.

What is claimed is:

1. An array substrate, comprising:
   a base substrate on which data lines and gate lines intersecting with each other are formed to define a plurality of pixel units arranged in a matrix form, and a switching element and a pixel electrode or a common electrode are provided in each of the plurality of pixel units,
   wherein the switching element comprises:
   a gate electrode, an active layer, a source electrode and a drain electrode, with end parts of the source electrode and the drain electrode located directly overlapping the active layer being provided to be opposite to each other to define a channel region;
   an extension conductive part formed adjacent the source electrode or the drain electrode and to electrically contact the source electrode or the drain electrode, wherein one end of the extension conductive part extends toward the channel region beyond the source electrode or the drain electrode contacting with the extension conductive part and to contact the active layer at least within the channel region, the extension conductive part is formed integrally with the pixel electrode or the common electrode, provided in a same layer and made of a same conductive material as the pixel electrode or the common electrode, wherein entirety of the drain electrode is in contact with the pixel electrode or the common electrode, and the extension conductive part is provided for only one of the drain electrode and the source electrode.

2. The array substrate according to claim 1, wherein the extension conductive part is formed from a transparent conductive material or a metal material.

3. The array substrate according to claim 1, wherein a material of the extension conductive part is different from a material of the source electrode and the drain electrode.

4. The array substrate according to claim 1, wherein a length of the channel region defined by the source electrode or the drain electrode is about 4.0 µm.

5. The array substrate according to claim 4, wherein an effective channel length region defined by the extension conductive part and the source and drain electrodes is about 2.0~3.5 µm.

6. The array substrate according to claim 1, wherein the extension conductive part is disposed above and/or below the source electrode or the drain electrode contacting with the extension conductive part.

7. The array substrate according to claim 1, wherein the source electrode, the drain electrode, the active layer and the data line are formed on a gate insulating layer, the pixel electrode or the common electrode for each of the plurality of pixel units is further formed on the gate insulating layer.

* * * * *